United States Patent
Wu et al.

(10) Patent No.: US 6,175,394 B1
(45) Date of Patent: Jan. 16, 2001

(54) CAPACITIVELY COUPLED FIELD EFFECT TRANSISTORS FOR ELECTROSTATIC DISCHARGE PROTECTION IN FLAT PANEL DISPLAYS

(76) Inventors: Chung-Cheng Wu; Wen-Jyh Sah, both of c/o Unipac Optoelectronics Corporation, No. 3 Industry E. Road III., Science-Based Industrial Park, Hsin-Chu City (TW)

(*) Notice: Under 35 U.S.C. 154(b), the term of this patent shall be extended for 0 days.

(21) Appl. No.: 08/760,101

(22) Filed: Dec. 3, 1996

Related U.S. Application Data

(60) Provisional application No. 60/009,471, filed on Dec. 28, 1995.

(51) Int. Cl.[7] .............................. G02F 1/136; H01L 45/00
(52) U.S. Cl. ................................ 349/40; 349/43; 257/360
(58) Field of Search ................................. 349/38, 39, 40, 349/41, 42; 445/24; 361/58, 91; 257/355, 356, 360, 59, 72

(56) References Cited

U.S. PATENT DOCUMENTS

| | | | |
|---|---|---|---|
| 4,786,956 | * 11/1988 | Puar . | |
| 5,019,002 | 5/1991 | Holmberg | 445/24 |
| 5,086,365 | * 2/1992 | Lien | 361/58 |
| 5,220,443 | 6/1993 | Noguchi | 359/59 |
| 5,233,448 | * 8/1993 | Wu | 349/40 |
| 5,285,302 | * 2/1994 | Wu | 349/39 |
| 5,521,728 | * 5/1996 | Kodate et al. | 349/40 |
| 5,606,340 | * 2/1997 | Suzuki et al. | 349/42 |

* cited by examiner

Primary Examiner—William L. Sikes
Assistant Examiner—Tai V. Duong
(74) Attorney, Agent, or Firm—Rabin & Champagne, P.C.

(57) ABSTRACT

A flat panel display includes a plurality of parallel row select lines and a plurality of column drive lines, with the row select lines and the column drive lines intersecting to define a matrix of pixel locations. Signals are provided to contact pads located on the periphery of the display and the signals flow over the row select lines and the column drive lines to thin film transistors located adjacent a pixel electrode at each of the pixel locations. The signals provided to each thin film transistor cause the transistor to charge a corresponding pixel electrode to control a pixel of the display. ESD protection for the display comprises a guard ring adjacent the contact pads. Capacitively coupled field effect transistors (CCFETs) connect the row select lines to the guard ring and connect the column drive lines to the guard ring. A CCFET is formed as a thin film transistor and typically has a floating gate capacitively coupled to the drain and source of the thin film transistor.

11 Claims, 6 Drawing Sheets

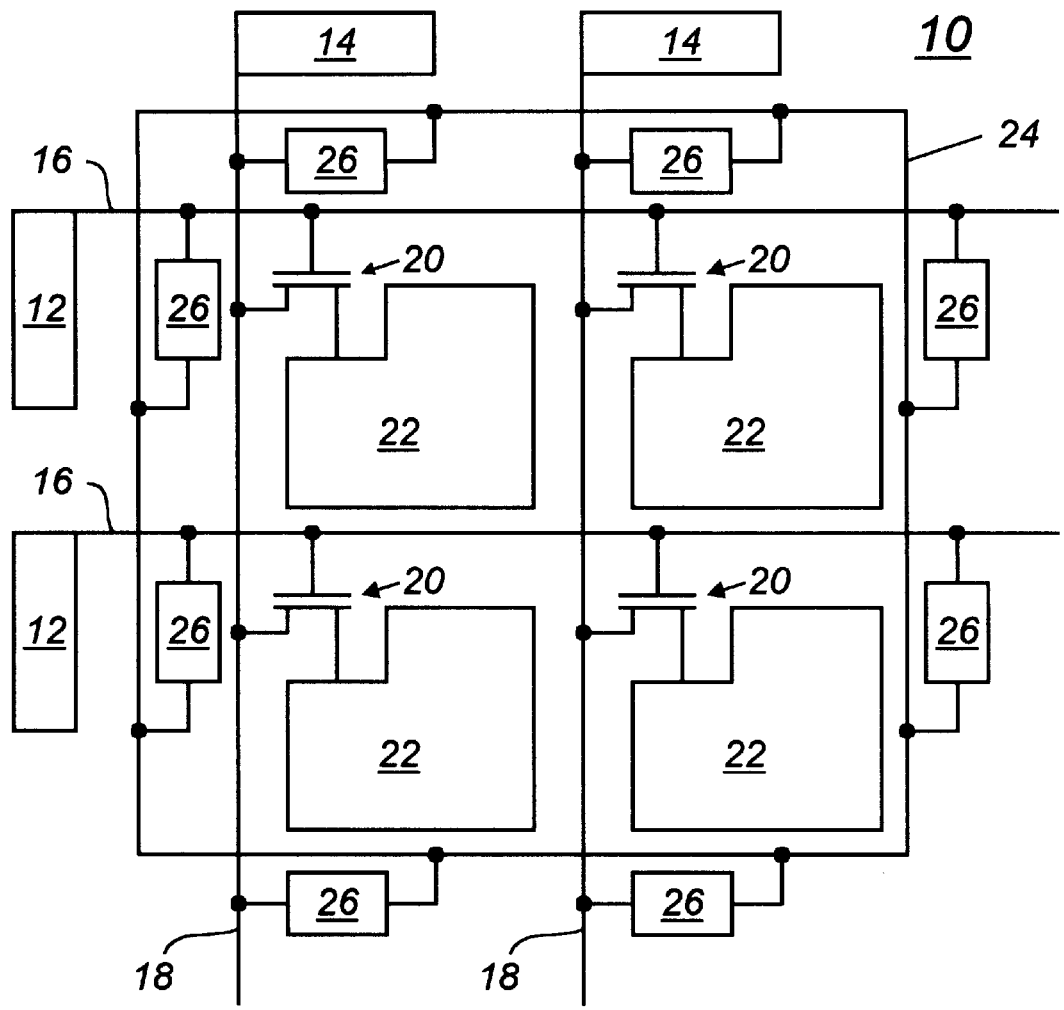
FIG. 1 -- Prior Art
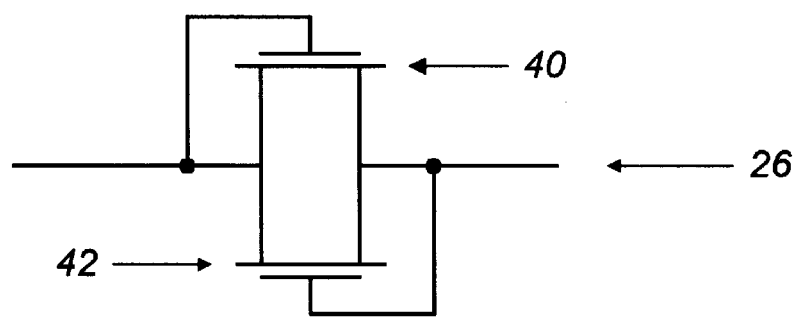
FIG. 2 -- Prior Art

CAPACITIVELY COUPLED FIELD EFFECT TRANSISTORS FOR ELECTROSTATIC DISCHARGE PROTECTION IN FLAT PANEL DISPLAYS

This application claims priority from provisional application Ser. No. 60/009,471, filed Dec. 28, 1995.

BACKGROUND OF THE INVENTION

1. Field of the Invention

The present invention relates to the provision of electrostatic discharge (ESD) protection for flat panel displays incorporating thin film transistors (TFTs) in the pixel drive circuitry.

2. Description of the Related Art

Recently, there has been growing commercial utilization of flat panel displays both as a replacement for the conventional CRT display and as a display for applications in which a CRT display is impractical, such as in portable computers and in viewers for video cameras. There are a variety of flat panel display technologies, including liquid crystal displays (LCDs), plasma displays and field emission displays. Of these, LCD technology has found the greatest level of acceptance in view of the comparative simplicity of the technology and the comparative ease of production. Flat panel displays are conventionally manufactured by forming electronic circuitry on an optically transparent substrate (e.g., glass) using photolithographic processing techniques (deposition, mask definition and etching) to form semiconductor thin film transistors (TFTs) and the other circuitry used for addressing and driving the pixels of the display. Generally, an electrically excitable medium is provided in close proximity to the driving electronics, and signals provided to the electrically excitable medium by the driving electronics cause the electrically excitable medium to produce a modulated optical signal. In the case of plasma displays, the electrically excitable medium itself generates the modulated optical signal. In other cases, such as twisted nematic liquid crystal displays (TN-LCDs), a light source is provided adjacent the electronically excitable medium (i.e., the liquid crystal) and the electronically excitable medium is used as a graduated light valve to modulate the light passing through the liquid crystal.

Typically, flat panel displays are configured as a matrix array of addressable pixel locations, with corresponding drive circuitry provided to drive each pixel independently. In an exemplary configuration of a TN-LCD, one thin film transistor (TFT) is provided adjacent each pixel for locally exciting the liquid crystal material which serves as the electrically excitable medium of the TN-LCD. The TFT is coupled to a pixel electrode, a column signal line and a row signal line. Signals provided to the TFT over the column signal line and the row signal line determine whether the TFT causes the pixel electrode to be at a high potential which excites the liquid crystal, or at a low potential which does not excite the liquid crystal. FIG. 1 illustrates a small portion of the drive circuitry formed on the backplane of a TN-LCD. The backplane may be formed, for example, on a glass substrate 10 and the illustrated circuitry can be used to excite the liquid crystal material. Row select signals are provided at row contact pads 12 and through row bus lines 16; column drive signals are provided at column contact pads 14 and through column bus lines 18. Thin film transistors (TFTs) 20 adjacent the intersections between the row and column lines act as switching elements for coupling drive signals to individual pixel locations. When the TFTs are turned on, charge can flow to the pixel electrodes 22 to charge the capacitor formed by the pixel electrode 22 and a ground electrode formed on the front substrate of the display (not shown). Liquid crystal fills the gap of this capacitor, so that the charge flowing through the thin film transistor generates an electrical field across the adjacent liquid crystal. The thin film transistors 20 are typically formed from amorphous silicon on the surface of the glass substrate 10 or on one or more thin film layers deposited on the glass substrate 10.

A common failure mode for the circuitry illustrated in FIG. 1 involves the destruction of an insulation layer, such as the silicon nitride gate insulator often used in TFTs, as a result of electrostatic discharge (ESD). ESD might generate a large transient potential between a column line and a row line of a TN-LCD, in turn causing the breakdown of the silicon nitride of the TFT at the intersection between the column line and the row line. After the silicon nitride undergoes dielectric breakdown, the silicon nitride is no longer an effective insulator and the affected TFT acts as a short-circuit between the corresponding column line and row line. This failure mode has been recognized, for example, in U.S. Pat. No. 5,019,002 to Holmberg. The Holmberg patent states that this electrostatic discharge mode can be avoided by providing a guard ring around the active elements of the display, with the guard ring coupled to the row and column lines of the display. This guard ring structure is schematically illustrated in FIG. 1. Guard ring 24 is typically formed from a low resistivity conductor, which might be a metal such as aluminum, and the guard ring is coupled to the row and column lines 16, 18 adjacent the contact pads 12, 14 by protection circuit elements 26. According to the Holmberg patent, the protection circuit elements 26 might be a thin film transistor without a gate, that is, each of the protection circuit elements 26 might consist of two amorphous silicon diodes in a back to back configuration except that the diodes are coupled by an amorphous silicon resistor.

There are substantial drawbacks to the structure described in the Holmberg patent. To provide effective ESD protection, guard ring 24 must remain connected to the backplane's drive circuitry throughout the assembly and test of the display. Under some circumstances, it is desirable to leave the guard ring connected to the drive circuitry after completion of the display so that the ESD protection is provided for the completed display. Whether for testing purposes or in the course of the normal operation of the display, it is necessary to provide signals to the thin film transistors to drive the pixels of the display. As such, the protection circuit elements 26 could drain away driving current from a point immediately adjacent the contact pads for the display. Accordingly, it is necessary to ensure that the protection circuit elements have a substantial resistance, at least to relatively low frequency drive signals. To this end, a high resistance, intrinsic amorphous silicon (a-Si) resistor is typically incorporated in the protection circuit element 26 used to form the ESD protection structure of the Holmberg patent. The resistance of such an intrinsic a-Si resistor is very high (>G$\Omega$) and causes the protection circuit element 26 to provide only a weak coupling between the guard ring 24 and the row and column lines 16, 18, even for the large transients associated with ESD. As such, the ESD protection circuit illustrated in the Holmberg patent provides inadequate protection from ESD damage for the TN-LCD.

An improvement to the Holmberg patent's ESD protection circuit is described in U.S. Pat. No. 5,220,443 to Noguchi. In the Noguchi patent's ESD protection circuit, illustrated in FIG. 2, a pair of thin film field effect transistors 40, 42 (TFTs) form an ESD protection circuit element 26 that may be used in the circuitry illustrated in FIG. 1. The gate of transistor 40 is connected to both the drain of transistor 40 and the source of transistor 42, and the gate of transistor 42 is connected to both the drain of transistor 42 and the source of transistor 40. As such, the source of transistor 40 is connected to the drain of transistor 42 and the drain of transistor 40 is connected to the source of transistor 42. The common node consisting of the drain of transistor 40 and the source of transistor 42 forms an input terminal for the FIG. 2 protection circuit element. The common node between the drain of transistor 42 and the source of transistor 40 forms an output terminal for the FIG. 2 circuit. Significantly improved ESD protection is obtained when the FIG. 2 protection circuit is used in the FIG. 1 guard ring structure, as compared to the performance of the Holmberg patent's ESD protection circuit. The FIG. 2 protection circuit provides an acceptably large low frequency resistance so that the FIG. 1 guard ring structure can be used either during testing of the display or in the ordinary use of the display.

The FIG. 2 structure has certain undesirable characteristics. Two transistors must be provided to achieve an acceptable protection circuit element, but two transistors take up an undesirable amount of space. It would therefore be desirable to provide a circuit protection element which is more compact than the two transistor element described in the Noguchi patent. More importantly, the protection circuit element described in Noguchi requires that contacts be formed between the gate and the drain of the transistors. This connection requires the formation of a contact via and an interconnect that is not required in the processing of the thin film drive transistors. Accordingly, the protection circuit element illustrated in Noguchi undesirably requires processing steps unnecessary to the formation of the rest of the display. Accordingly, use of the ESD protection element illustrated in FIG. 2 increases the cost of flat panel displays and decreases yields slightly. It would therefore be desirable to form a protection circuit element that is more compatible with the processing normally used in the formation of the display and, most preferably, does not require any processing steps not necessary to the formation of thin film drive transistors.

SUMMARY OF THE PREFERRED EMBODIMENTS

In accordance with a first aspect of the present invention, a flat panel display includes a contact pad for providing a signal to the display and a drive circuit coupled to receive the signal provided at the contact pad. The drive circuit controls a pixel in response to the signal. A guard ring is provided adjacent to the contact pad and a protective circuit element couples the guard ring to the contact pad so that a transient signal applied to the contact pad is discharged to the guard ring. In the embodiment, the protective circuit element includes at least a first floating gate transistor having a floating gate, a drain and a source, wherein at least one of the drain and the source is capacitively coupled to the floating gate.

In a further aspect of this embodiment, a portion of the drain is vertically aligned with a portion of the floating gate and the drain gate capacitance is defined by a lateral overlap between the drain and the floating gate, the drain lateral overlap being of sufficient size to accommodate mask misalignment errors. The drain overlap is preferably greater than or equal to approximately one micron.

A different aspect of the first embodiment provides a second floating gate transistor in the protective circuit element, the second floating gate transistor having a floating gate, a drain and a source, with at least one of the drain and the source capacitively coupled to the floating gate. The drain of the first floating gate transistor is connected to the source of the second floating gate transistor and the source of the first floating gate transistor is connected to the drain of the second floating gate transistor.

In accordance with a different aspect of the present invention, a flat panel display has a contact pad for providing a signal to a drive circuit, the drive circuit including at least one thin film transistor coupled to receive the signal provided at the contact pad, the thin film transistor generating a voltage to control a pixel of the flat panel display in response to the signal. A guard ring is provided adjacent to the contact pad. A capacitively coupled field effect transistor is connected between the guard ring and the contact pad so that a transient signal applied to the contact pad is discharged to the guard ring. The capacitively coupled field effect transistor has a gate, a drain and a source, with at least one of the drain and the source capacitively coupled to the gate.

A further aspect of this second embodiment provides that the gate of the capacitively coupled field effect transistor is connected to a first capacitor electrode and to a second capacitor electrode, the first capacitor electrode being disposed adjacent to a first wiring line connected to the drain so as to define a capacitive coupling between the gate and the drain, the second capacitor electrode being disposed adjacent to a second wiring line connected to the source so as to define a capacitive coupling between the gate and the source.

In accordance with another aspect of the invention, a flat panel display includes a plurality of parallel row select lines and a plurality of parallel column drive lines, the row select lines and the column drive lines intersecting to define a matrix of pixels. Pixel electrodes are provided at the intersections of the plurality of parallel column drive lines and the plurality of column select lines and a plurality of thin film transistors are each coupled to a row select line, a column drive line and a pixel electrode. A guard ring is provided for the display and at least one capacitively coupled field effect transistor is connected between each of the row select lines and the guard ring and at least one capacitively coupled field effect transistor is connected between each of the column drive lines and the guard ring so that a potential applied to one of the row select lines or to one of the column select lines is discharged to the guard ring. In accordance with this embodiment, the capacitively coupled field effect transistor has a gate, a drain and a source, wherein at least one of the drain and the source is capacitively coupled to the gate.

BRIEF DESCRIPTION OF THE DRAWINGS

FIG. 1 schematically illustrates a portion of the drive circuitry for a flat panel display.

FIG. 2 illustrates a protection circuit element that might be used in the FIG. 1 circuit.

DETAILED DESCRIPTION OF THE PREFERRED EMBODIMENTS

Preferred embodiments of the present invention utilize a capacitively coupled field effect transistor (CCFET) as a protection circuit element without having to utilize processing steps outside of those normally used in the formation of thin film drive transistors. Certain preferred embodiments of the present invention utilize a single thin film transistor in conjunction with other circuit elements to provide effective ESD protection for a flat panel display.

Figure 3:
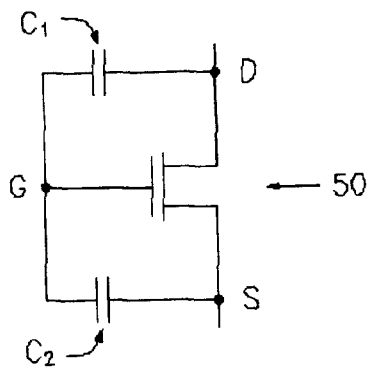
FIG. 3 illustrates a protection circuit element in accordance with an embodiment of the present invention.

FIG. 3 illustrates the equivalent circuit of a capacitively coupled field effect transistor (CCFET) for use in an ESD protection circuit in accordance with a preferred embodiment of the present invention. As the term is used herein, a capacitively coupled field effect transistor is a FET in which the gate of the FET is capacitively coupled to either the source or the drain of the FET. In particularly preferred embodiments of the present invention, the gate is capacitively coupled to both the source and the drain of the FET. Most preferably, the gate of the CCFET is floating except for the coupling between the gate and the source and drain regions. Referring to FIG. 3, the drain of CCFET 50 is electrically coupled to the gate of CCFET 50 by capacitance $C_1$ and the drain of CCFET 50 is electrically coupled to the gate of CCFET 50 by capacitance $C_2$. In accordance with particularly preferred embodiments of the present invention, capacitances $C_1$ and $C_2$ are adjusted to select the current-voltage characteristics of the CCFET for positive and negative transients.

Figure 4:
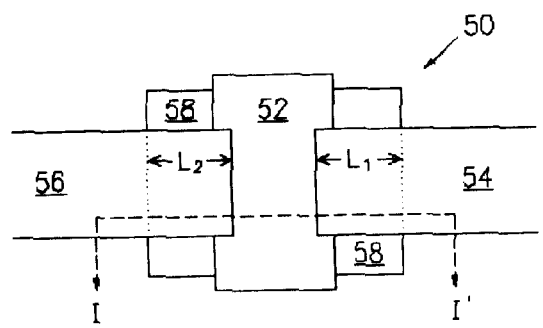
FIG. 4 is a plan view of an embodiment of the FIG. 3 protection circuit.
Figure 5:
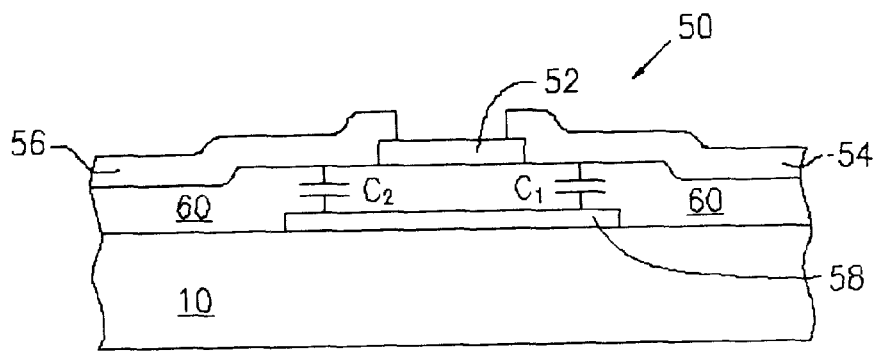
FIG. 5 is a sectional view along line I–I' of the FIG. 4 device.

FIG. 4 illustrates in plan view an embodiment of the FIG. 3 CCFET structure. The channel of the CCFET is defined within an amorphous silicon layer 52, while the drain 54, source 56 and gate 58 of the CCFET are formed from a highly conductive material such as aluminum, a silicide or a refractory metal. FIG. 5 provides a sectional view of the FIG. 4 device, illustrating a preferred construction of the FIG. 4 device. Gate 58 is formed on the glass substrate 10 of the display backplane, or on a layer of insulating material like $SiN_x$ deposited above the substrate, by first depositing a layer of a gate material such as aluminum and then performing photolithography to define the size and shape of the gate. Gate insulator 60 consists of $SiN_x$, or similar high dielectric constant material that acts as a reliable insulator and is compatible with TFT processing, deposited over the surface of gate 58. Amorphous silicon is deposited on the gate insulator 60 and is then masked and etched to define the amorphous silicon channel region 52 as illustrated in FIG. 4.

Of course, the channel region could be formed from polysilicon or from other types of semiconductor materials. Subsequently, aluminum or another highly conductive material is deposited over the amorphous silicon channel region 52 and the gate insulator 60. The deposited material is patterned by photolithography to form the drain 54 and source 56 lines of the CCFET 50 as illustrated in FIG. 4. It should be apparent from the above description that the structure of the CCFET and the method of making the CCFET are similar to the structure and method of making the thin film transistor typically used in flat panel displays such as TN-LCDs.

In the structure illustrated in FIGS. 4 and 5, the capacitive coupling between the drain and gate of CCFET 50 is primarily determined by the lateral overlap between the drain line 54 and the gate 58 indicated as $L_1$ in FIG. 4. Thus, the capacitance $C_1$ will vary linearly with the amount of lateral overlap $L_1$. In a similar manner, the capacitive coupling between the source and gate of CCFET 50 is primarily determined by the lateral overlap $L_2$ between the source line 56 and the gate 58, as illustrated. Again, the capacitance $C_2$ will vary linearly with the amount of lateral overlap $L_2$. Because the capacitances coupling the drain and gate and the source and gate for the device illustrated in FIG. 5 are formed immediately adjacent the gate itself, the capacitances are referred to herein as intrinsic.

For the CCFET illustrated in FIGS. 4 and 5 to provide effective coupling to a guard ring and prevent ESD, the lateral overlap $L_1$ between the drain 54 and the gate 58 which defines capacitance $C_1$ is most preferably made sufficiently large so as to provide a coupling between the drain 54 and the gate 58. Considering the typical characteristics of the materials used in the manufacture of the flat panel display, the typical device dimensions used for TFTs and CCFETs, and the state of processing technology typically used in the manufacture of TN-LCD devices, the minimum overlap $L_1$ to be provided is determined by the limits of the processing technology. In particular, mask alignment errors encountered in present display manufacturing processes may be approximately ±1.0 μm. Thus, the minimum $L_1$ preferred to allow for typical current processing conditions will be greater than or equal to approximately 1.0 μm, and preferably approximately 2~3 μm. By setting both $L_1$ and $L_2$ to be approximately 2~3 μm or more, $C_1$ and $C_2$ will be of the same order of magnitude, thereby ensuring that a sufficient fraction of the drain-source potential difference is capacitively coupled to the gate of the CCFET and the CCFET is turned on to prevent ESD damage, even allowing for mask alignment errors.

Figure 6:
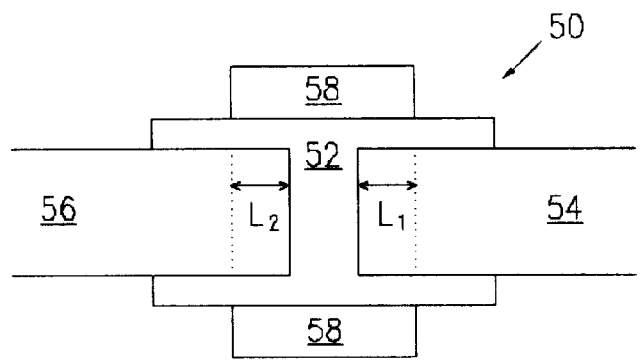
FIG. 6 is a plan view of a variation of the FIG. 4 structure.

Note that the source or drain and the gate could be capacitively coupled through the amorphous silicon layer 52. Such a structure is illustrated in FIG. 6, with the reference numerals in FIG. 6 representing similar structures to those illustrated in FIG. 4. In FIG. 6, the gate electrode 58 is narrower than the amorphous silicon layer so that the drain 54 and source 56 regions are capacitively coupled to the gate 56 through the amorphous silicon layer 52.

The most preferred embodiments of the present invention provide a coupling between the gate and one or both of the source and drain that is predominantly capacitive in nature. It should be noted, however, that a diode or transistor coupling might be suitable if an appropriate capacitive coupling were provided. A major difficulty with such alternate configurations is the likelihood that such diodes or transistors will be undesirably leaky, particularly when formed from amorphous silicon.

Figure 7:
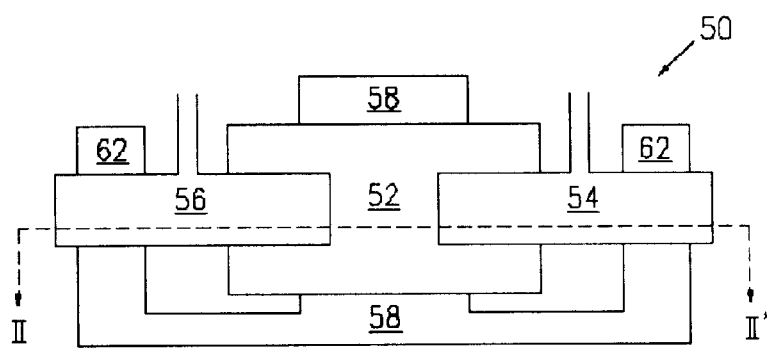
FIG. 7 is a plan view of another embodiment of the FIG. 3 protection circuit.

A second configuration of a CCFET 50 in accordance with the present invention is illustrated in plan view in FIG. 7.

Figure 8:
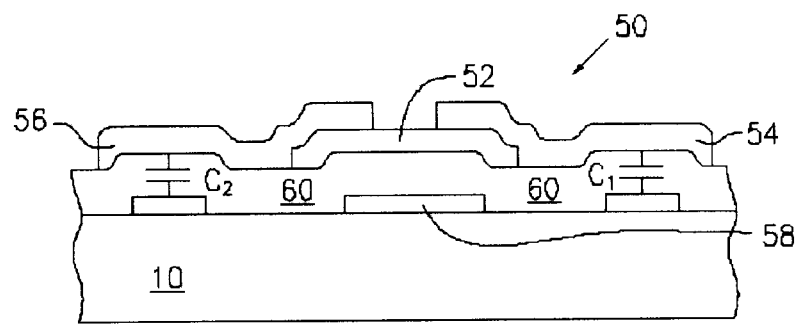
FIG. 8 is a sectional view along line II–B' of the FIG. 7 device.

FIG. 8 presents a cross sectional view of the CCFET 50 along the line B–B' shown in FIG. 7. Like reference numerals are used to identify like elements in each of the figures. As with the CCFET of FIGS. 4 and 5, the CCFET 50 illustrated in FIGS. 7 and 8 has a gate 58 deposited on an insulating substrate, a gate insulator 60, a channel 52 formed from an amorphous silicon film, and conductive drain 54 and source 56 lines formed from a conductive material such as aluminum. Conductive lines 62 are connected to and extend away from the gate 58 and form the plates of capacitors $C_1$ and $C_2$ that provide most of the coupling between the drain 54 and source 56 to the gate 58. As shown in FIG. 8, the conductive lines 62 are physically spaced apart from the gate 58 and are located under the drain 54 and the source 56. However, as shown in the figure, the conductive lines 62 are still in electrical connection with the gate 58. A smaller amount of capacitive coupling is provided by the overlap between the drain 54 and source 56 within the gate 58. Thus, in the CCFET 50 illustrated in FIGS. 7 and 8, the capacitors are formed as independent structures. This structure is referred to herein as "extrinsic." Although the extrinsic capacitor structure may take more space in some circumstances than the intrinsic capacitor structure illustrated in FIGS. 4 and 5, the extrinsic structure has the advantage of providing better defined capacitances. In the extrinsic structure, the capacitances $C_1$ and $C_2$ have a much reduced dependence on the precision of a mask alignment. The extrinsic structure is thus more easily processed and cheaper to produce reliably than the intrinsic structure.

Figure 9:
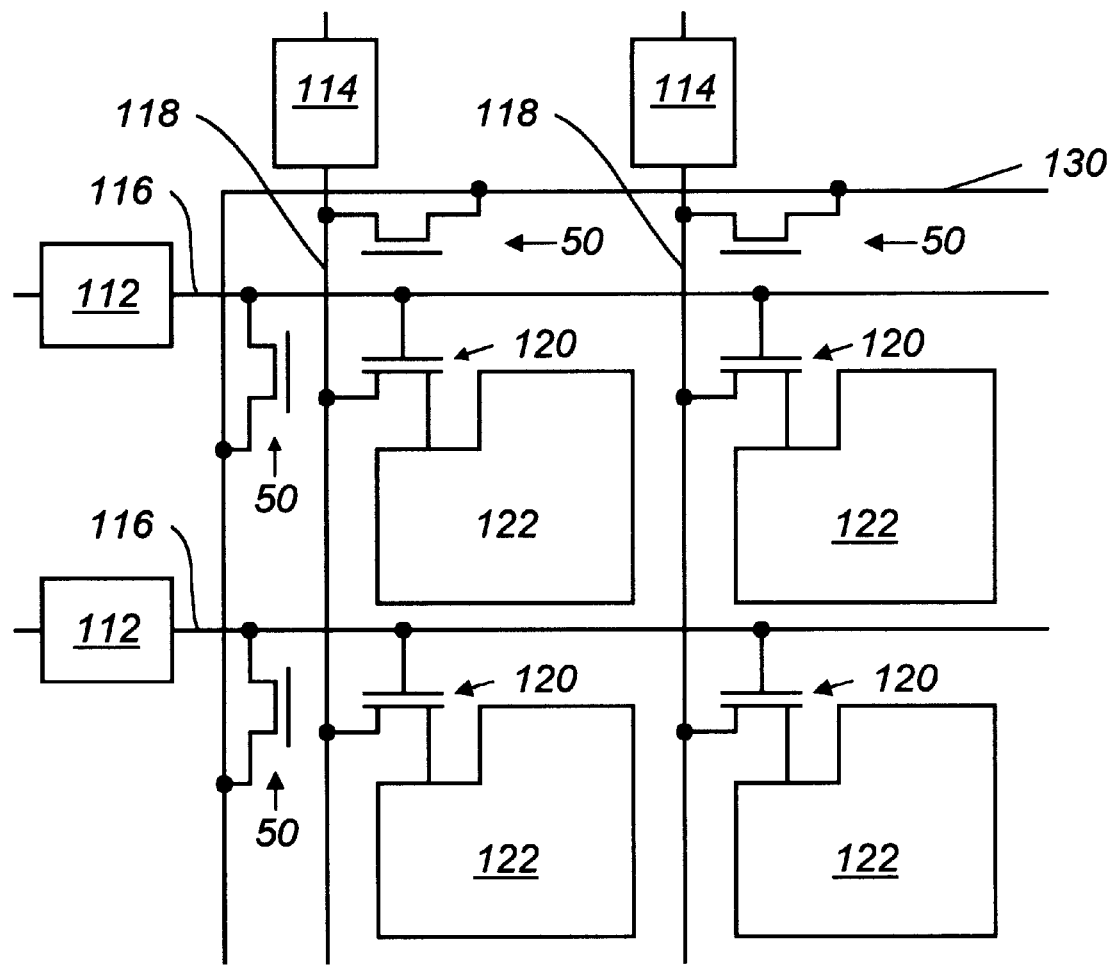
FIG. 9 schematically illustrates a portion of the drive circuitry for a flat panel display incorporating an embodiment of an ESD protection circuit in accordance with the present invention.

A portion of the backplane of a flat panel display incorporating an ESD prevention circuit in accordance with the present invention is illustrated in FIG. 9. The drive circuits illustrated in FIG. 9 are, of course, only a small portion of the total number of drive circuits that would typically be used in a flat panel display. The configuration and operation of the FIG. 9 circuit are similar to that of the flat panel display illustrated in FIG. 1, and so only a brief discussion of the components and operation of the FIG. 9 display is provided herein. Row select signals are provided to control thin film drive transistors 120 at row contact pads 112 over row bus lines 116. Column drive signals are provided to the TFTs from column contact pads 114 over column bus lines 118. When signals from the row lines 116 turn the TFTs on, whatever current flows from the individual column drive lines 118 into the corresponding pixel electrodes 122 charges the capacitor formed by the pixel electrode 122 and a ground electrode on the front substrate (not shown). The charge present at the individual pixel electrodes 122 produces a local electrical field across the adjacent electrically excitable medium which determines the grey level of the individual pixel. For example, if the FIG. 9 configuration is used for a TN-LCD, the charge on the pixel electrode 122 may determine the alignment of the liquid crystal molecules in a cell controlled by the pixel electrode.

A guard or short ring 130 is provided around the drive circuitry illustrated in the FIG. 9 flat panel display, lying between the contact pads and the bus lines which carry signals to the thin film drive transistors. Although the guard ring 130 is referred to herein as a "ring," such an identification is for consistency with the normal terminology used in describing such structures. It is not necessary that the guard ring form a closed loop. Rather, preferred embodiments of a guard ring for use in embodiments of the present invention provide a high conductivity path within the flat panel display to a constant potential such as ground. The particular guard ring configuration shown in FIG. 9 is known as an inner guard ring structure, and it is conventional to leave such an inner guard ring in place after the completion of the display. For typical assembly or test operations on the flat panel display, the guard ring 130 is held at a fixed potential such as ground. The row lines 116 and column lines 118 of the flat panel display are coupled to the guard ring 130 via a capacitively coupled field effect transistor (CCFET) 50 such as that illustrated in FIGS. 3–8. Although the CCFET 50 shown in FIG. 9 is represented by a symbol which is similar to that used to represent a floating gate transistor, it should be understood that the protection circuit element illustrated in FIG. 9 is a CCFET made in accordance with one of the preferred embodiments of the present invention.

When a CCFET in accordance with the embodiments illustrated in FIGS. 3–8 is used in the FIG. 9 flat panel display drive circuitry, the floating gate of the CCFET provides a capacitive interconnection between the guard ring and the row and column lines of the display. The gate voltage is given by:

$$V_G = \frac{C_1 V_D + C_2 V_S}{C_1 + C_2},$$

where $V_D$ and $V_S$ are the drain and the source voltages, respectively. In response to a voltage transient of the sort associated with ESD, a potential difference between the source and drain will turn the CCFET on and the electrostatic charge can be drained away from the row select lines 116 and the column drive lines 118.

Figure 10:
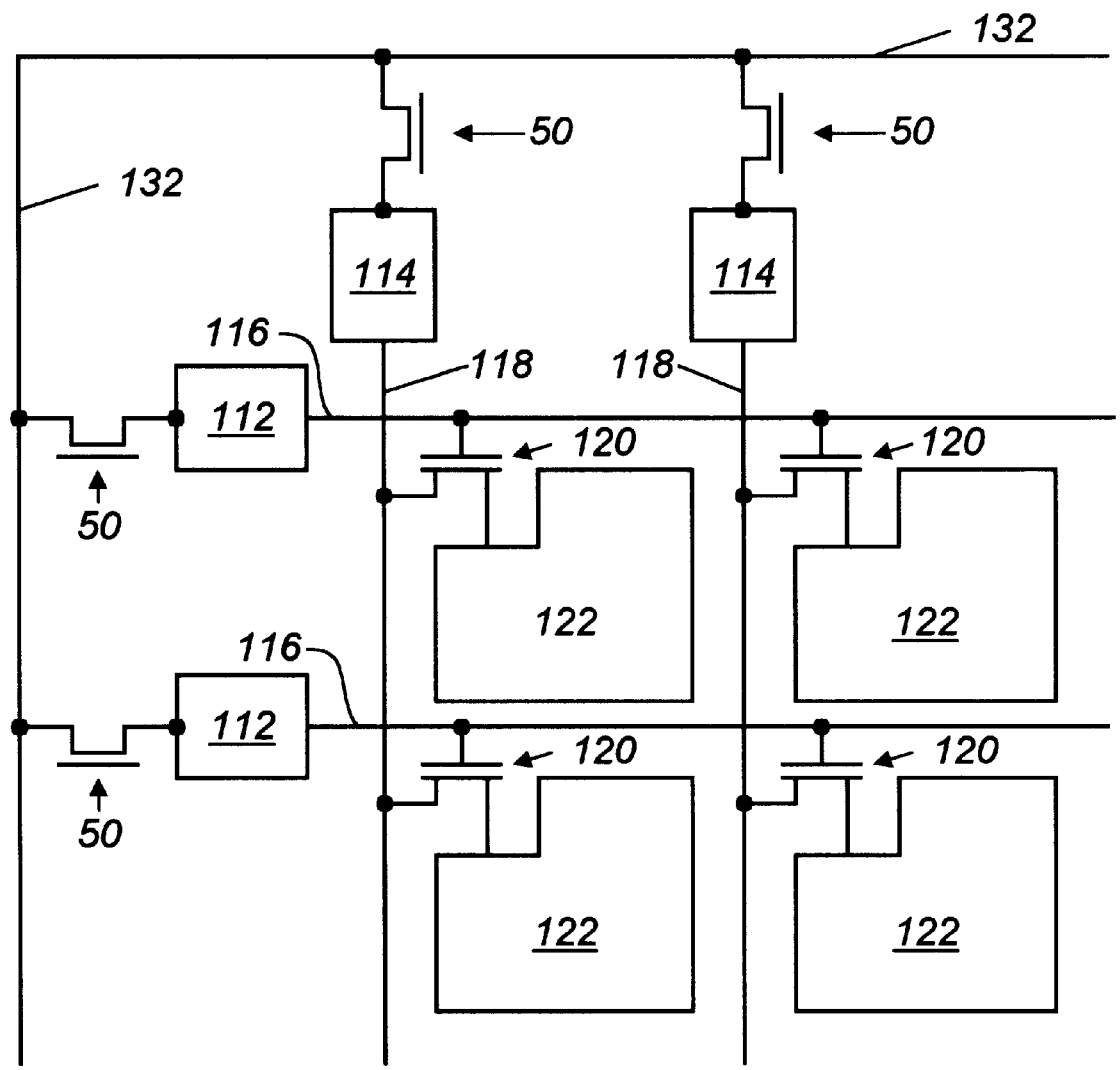
FIG. 10 schematically illustrates a portion of the drive circuitry for a flat panel display incorporating another embodiment of an ESD protection circuit in accordance with the present invention.

The CCFET 50 can also be used in an outer guard ring configuration for preventing ESD damage. Such an outer guard ring configuration is shown in FIG. 10. Guard ring 132 is disposed outside both the drive circuitry and the contact pads and CCFETs 50 couple the outer guard ring 132 to the contact pads 112, 114. During assembly and test, the guard ring 132 is typically held at a constant potential such as ground. Conventionally, the guard ring 132 is removed when processing of the display is complete.

Figure 11:
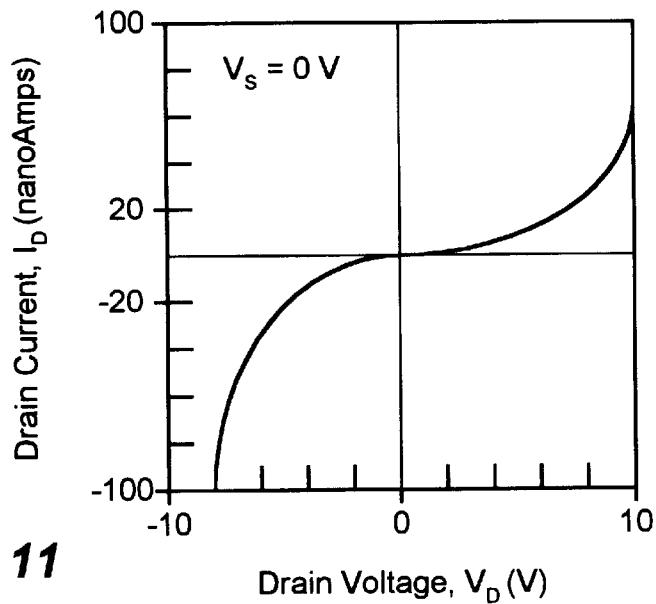
FIG. 11 illustrates the I–V performance of an embodiment of a protection circuit element in accordance with the present invention.
Figure 12:
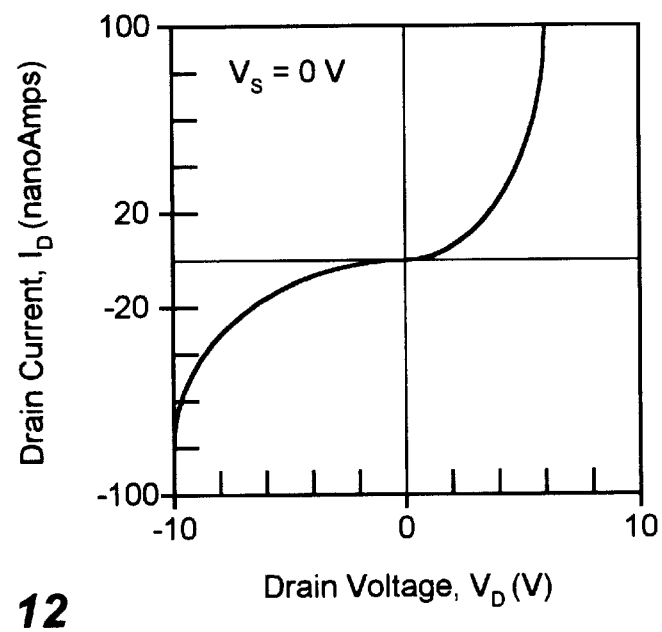
FIG. 12 illustrates the I–V performance of another embodiment of a protection circuit element in accordance with the present invention.

The current-voltage characteristics of CCFET 50 are shown in FIG. 11. More particularly, the figure illustrates the I–V characteristics at the drain of a CCFET for $C_1=C_2$, $V_G=\frac{1}{2}(V_D+V_S)$, with the source voltage held at ground. It is apparent from this figure that the conducting current of the CCFET is very high and that the on-state resistance is on the order of tens of MΩs. By adjusting the relative size of the drain and source capacitances $C_1$ and $C_2$ of the CCFET, the I–V characteristics can be adjusted to present different impedances to positive and negative transients. FIG. 12 shows the current-voltage characteristics of a CCFET with $C_1=2 \cdot C_2 (V_G=\frac{2}{3}V_D+\frac{1}{3}V_S)$. As shown, it is possible to increase the conducting current for $V_D>V_S$ as compared with the equal capacitance ($C_1=C_2$) CCFET illustrated in FIG. 11.

Figure 13:
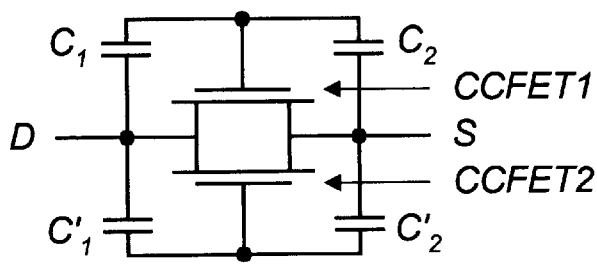
FIG. 13 illustrates another embodiment of a protection circuit in accordance with the present invention.

If it is desirable to obtain still higher levels of conductance, then it is possible to form a protective circuit element having two CCFETs. Such a protective circuit element is illustrated in FIG. 13. In the illustrated protective circuit element, the capacitances of $CCFET_1$ are selected so that $C_1 >> C_2$, and the capacitances of $CCFET_2$ are selected so that $C_1' << C_2'$. In the illustrated configuration, $CCFET_1$ conducts most of the current for $V_D>V_S$, and $CCFET_2$ conducts most of the current for $V_D<V_S$. Although this configuration of protective circuit element takes more space than a single transistor configuration, the protective circuit element illustrated in FIG. 13 still retains the advantage of high compatibility with the typical manufacturing process used for thin film transistors. The FIG. 13 element allows for higher currents and for greater flexibility in selecting the I–V characteristics than the single transistor CCFET illustrated in FIGS. 3–8.

While the present invention has been described in terms of particular preferred embodiments, it is to be understood that the following claims describe the scope of what the inventors believe to be their invention. The following claims are not to be limited to a particular embodiment but are instead intended to encompass changes and modifications to the invention described herein. For example, while the embodiments described above use amorphous silicon in the formation of transistors, the transistors might also be formed in polycrystalline silicon or single crystal silicon formed on the substrate of the flat panel display. In addition, although the embodiments above have made specific mention of the TN-LCD form of flat panel display, the CCFET ESD protection circuits described above would find application in other types of flat panel displays.

What is claimed:

1. A flat panel display, comprising:

a contact pad for providing a signal to the flat panel display;

a drive circuit coupled to receive the signal provided at the contact pad, the drive circuit controlling a pixel of the flat panel display in response to the signal;

a guard ring adjacent to the contact pad; and a protective circuit element coupling the guard ring to the contact pad so that a transient signal applied to the contact pad is discharged to the guard ring, the protective circuit element comprising at least a floating gate transistor, the floating gate transistor comprising:

a floating gate comprising a first layer of conductive material, a drain and a source formed in a second layer of conductive layer, and two conductive lines connected to and extending from the gate beneath the drain and source, respectively;

a channel region comprising silicon coupling the source to the drain, and a gate insulator formed between the floating gate and the channel region, the gate insulator separating the floating gate from the channel region and from the source and drain, the gate insulator further separating the two conductive lines from both the drain and the source wherein the drain, the gate insulators and a first one of the two conductive lines define a drain-gate capacitor, wherein the drain, the gate insulator, and a second one of the two conductive lines define a source-gate capacitor, and wherein the drain-gate capacitor and the source-gate capacitor have respective capacitances of about a same magnitude.

2. The flat panel display of claim 1, wherein the drain is vertically aligned with the first one of the two conductive lines and the drain-gate capacitance is defined by a drain lateral overlap between the drain and the first one of the two conductive lines, the drain lateral overlap being of a sufficient size to accommodate mask misalignment errors.

3. The flat panel display of claim 1, wherein the drain is vertically aligned with the first one of the two conductive lines and the drain-gate capacitance is defined by a drain lateral overlap, wherein the source is vertically aligned with the the second one of the two conductive lines and the source-gate capacitance is defined by a source lateral overlap.

4. A flat panel display, comprising:

a contact pad for providing a signal to the flat panel display;

a drive circuit coupled to receive the signal provided at the contact pad, the drive circuit controlling a pixel of the flat panel display in response to the signal;

a guard ring adjacent to the contact pad; and a protective circuit element coupling the guard ring to the contact pad so that a transient signal applied to the contact pad is discharged to the guard ring, the protective circuit element comprising at least a floating gate transistor, the floating gate transistor comprising:

a floating gate comprising a first layer of conductive material, first and second conductive lines connected to and extending from the floating gate, a drain and a source formed in a second layer of conductive material, a channel region comprising silicon coupling the source to the drain, and a gate insulator formed between the floating gate and the channel region, the gate insulator separating the drain from the floating gate, the gate insulator further separating the drain from the first conductive line so that the drain and the first conductive line define two plates of a drain-gate capacitor, the gate insulator also separating the source from the floating gate and from the second conductive line, wherein the source and the second conductive line define two plates of a source-gate capacitor, wherein the drain is vertically aligned with the first conductive line and the drain-gate capacitance is defined by a drain lateral overlap, wherein the source is vertically aligned with the second conductive line and the source-gate capacitance is defined by a source lateral overlap and wherein the drain lateral overlap is greater than or equal to approximately one micron and the source lateral overlap is greater than or equal to approximately one micron.

5. The flat panel display of claim 4, wherein the drain of the floating gate transistor is connected to the contact pad and the source of the floating gate transistor is connected to the guard ring.

6. A flat panel display comprising:

a contact pad for providing a signal to a drive circuit within a flat panel display;

the drive circuit comprising at least one thin film transistor coupled to receive the signal provided at the contact pad, the thin film transistor generating a voltage to control a pixel of the flat panel display in response to the signal;

a guard ring adjacent to the contact pad;

a capacitively coupled field effect transistor coupled to the guard ring and the contact pad, the capacitively coupled field effect transistor having a gate, a drain and a source, wherein at least one of the drain and the source is capacitively coupled to the gate; and a first capacitor electrode and to a second capacitor electrode, the first capacitor electrode being disposed adjacent to a first wiring line connected to the drain so as to define a capacitive coupling between the gate and the drain, the second capacitor electrode being disposed adjacent to a second wiring line connected to the source so as to define a capacitive coupling between the gate and the source.

7. The flat panel display of claim 6, wherein the first capacitor electrode is connected to the gate by a conductive layer and the first capacitor electrode is spaced apart from the gate.

8. The flat panel display of claim 6, wherein the drain and the first wiring line are formed from a single, continuous conducting layer.

9. The flat panel display of claim 6, further comprising:

a channel region adjacent the gate, the channel region comprising a semiconductor material; and a gate insulator separating the gate and the channel region, the gate insulator separating the first capacitor electrode and the first wiring layer, and the gate insulator separating the second capacitor electrode and the second wiring layer, so that the first capacitor electrode and the first wiring layer form, at least in part, a parallel plate capacitor and so that the second capacitor electrode and the second wiring layer form, at least in part, a parallel plate capacitor.

10. A flat panel display comprising:

a contact pad for providing a signal to a drive circuit within the flat panel display;

the drive circuit comprising at least one thin film transistor coupled to receive the signal provided at the contact pad, and the thin film transistor generating a voltage to control a pixel of the flat panel display in response to the signal;

a guard ring adjacent to the contact pad; and a capacitively couple field effect transistor connected between the guard ring and the contact pad so that a potential difference between the contact pad and the guard ring is discharged to the guard ring, the capacitively coupled field effect transistor having:

a gate, a drain and a source, wherein at least one of the drain and the source is capacitively coupled to the gate, a channel region adjacent the gate, the channel region comprising silicon; and a gate insulator separating the gate from the channel region, wherein the channel region extends over all edges of the gate, so that at first and second peripheral portions of the channel region extending under the source and the drain, respectively, a vertical overlap of the source, the channel, the gate insulator, and the gate forms an equivalent of a source-gate capacitor, and a vertical overlap of the drain, the channel region, the gate insulator, and the gate forms an equivalent of a drain-gate capacitor.

11. The flat panel display of claim 10, wherein a capacitance of the source-gate capacitor is proportionate to an amount that the first peripheral portion extends under the drain, and a capacitance of the drain-gate capacitor is proportionate to an amount that the second peripheral portion extends under the source.

* * * * *